(12) United States Patent
Akram et al.

(10) Patent No.: US 6,329,712 B1
(45) Date of Patent: Dec. 11, 2001

(54) HIGH DENSITY FLIP CHIP MEMORY ARRAYS

(75) Inventors: Salman Akram, Boise; Warren M. Farnworth, Nampa; Alan G. Wood, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/047,796

(22) Filed: Mar. 25, 1998

(51) Int. Cl.[7] .............................. G11C 7/00; H01L 23/12; H01L 23/053
(52) U.S. Cl. .................. 257/700; 257/701; 257/209; 257/202; 257/738; 257/737; 257/734; 257/728; 257/758; 257/690; 365/51; 365/63; 365/230.03
(58) Field of Search .................... 257/778, 738, 257/737, 734, 728, 692, 693, 690, 758, 700, 701, 209, 202, 784, 786; 365/51, 230.03, 63

(56) References Cited

U.S. PATENT DOCUMENTS

| | | | | |
|---|---|---|---|---|
| Re. 36,469 | * | 12/1999 | Wood et al. .......................... 257/685 |
| 5,068,603 | * | 11/1991 | Mahoney ............................. 714/726 |
| 5,128,737 | * | 7/1992 | Have .................................... 257/503 |
| 5,161,124 | * | 11/1992 | Love .................................... 365/222 |
| 5,223,454 | * | 6/1993 | Uda et al. ............................ 438/670 |
| 5,386,623 | * | 2/1995 | Okamoto et al. ...................... 29/832 |
| 5,432,999 | * | 7/1995 | Capps et al. ......................... 438/109 |
| 5,471,087 | * | 11/1995 | Buerger, Jr. . |
| 5,506,499 | * | 4/1996 | Puar ................................... 324/158.1 |
| 5,629,838 | * | 5/1997 | Knight et al. ........................ 361/782 |
| 5,637,920 | | 6/1997 | Loo .................................... 257/700 |
| 5,640,340 | * | 6/1997 | Fink ................................... 365/149 |
| 5,686,762 | * | 11/1997 | Langley .............................. 257/775 |
| 5,751,065 | | 5/1998 | Chittipeddi et al. ................. 257/758 |
| 5,808,330 | | 9/1998 | Rostoker et al. ..................... 257/208 |
| 5,815,427 | * | 9/1998 | Cloud et al. ........................... 365/51 |
| 5,817,540 | | 10/1998 | Wark ................................... 438/107 |
| 5,843,799 | * | 12/1998 | Hsu et al. ............................... 438/6 |
| 5,844,297 | * | 12/1998 | Crafts et al. . |
| 5,856,705 | * | 1/1999 | Ting ................................... 257/758 |
| 5,859,801 | * | 1/1999 | Poechmueller ...................... 365/200 |
| 5,883,427 | * | 3/1999 | Arimoto .............................. 257/690 |
| 5,898,223 | * | 4/1999 | Frye et al. ........................... 257/777 |
| 5,905,305 | * | 5/1999 | Fogal et al. ......................... 257/712 |
| 5,915,167 | * | 6/1999 | Leedy ................................. 438/108 |
| 5,930,162 | * | 7/1999 | Peterson ............................. 365/151 |
| 5,936,305 | * | 8/1999 | Akram ................................ 257/723 |
| 5,943,285 | * | 8/1999 | Kohno ............................ 365/230.03 |
| 5,946,545 | * | 8/1999 | Bertin et al. .......................... 438/15 |
| 5,946,553 | * | 8/1999 | Wood et al. ......................... 438/108 |
| 5,990,564 | * | 11/1999 | Degani et al. . |
| 5,999,440 | * | 12/1999 | Crafts ................................. 365/149 |
| 6,054,334 | | 4/2000 | Ma ....................................... 438/14 |
| 6,124,195 | | 9/2000 | Duesman et al. ................... 438/601 |
| 6,162,652 | | 12/2000 | Dass et al. .......................... 438/601 |
| 6,165,885 | | 12/2000 | Gaynes et al. ...................... 257/737 |
| 6,169,329 | | 1/2001 | Farnworth et al. ................. 257/780 |
| 6,187,658 | | 2/2001 | Chittipeddi et al. ................. 438/612 |

* cited by examiner

Primary Examiner—Alexander O. Williams
(74) Attorney, Agent, or Firm—TraskBritt, P.C.

(57) ABSTRACT

A low alpha emissivity-induced error solder bump, flip chip integrated circuit device. The device includes a semiconductor die having an active surface and a bond pad array disposed about the active surface of the die. The active surface of the die includes logic circuits adjacent memory cell arrays. Each of the bond pads directly overlays a logic circuit, to which they may be connected. The present invention also includes methods for designing and fabricating the invented devices and connecting them to a carrier substrate.

37 Claims, 4 Drawing Sheets

HIGH DENSITY FLIP CHIP MEMORY ARRAYS

BACKGROUND OF THE INVENTION

A. Field of the Invention

The present invention relates to flip chip type integrated circuit devices with decreased susceptibility to memory loss caused by alpha particles. Particularly, the bond pads of the device of the present invention are positioned on the device in a manner which significantly reduces or eliminates the tendency of alpha particles emitted from solder bumps or balls formed thereon to enter the memory arrays of the device. More particularly, the bond pads of the integrated circuit of this invention are positioned directly over the logic portions of the device. Another aspect of the present invention includes the placement of bond pads on the active surface of a DRAM integrated circuit, over the logic circuits thereof. The present invention also relates to integrated circuit devices which have a reduced length of circuitry between the logic portions thereof and the bond pads operatively connected therewith.

B. Background of Related Art

Integrated circuits (ICs), also known as "chips" or "dice" which use solder-type inverted "flip chip" or Controlled Collapse Chip Connection (C4) bonding technology are well known in the industry. Many flip chip integrated circuits are bonded to the substrate by lead/tin (Pb/Sn) solders, which are known to emit helium nuclei, also referred to as alpha particles. Flip chips which include bond pads in area arrays are subject to alpha particle penetration, which can create a "cloud" in the die surface. Such clouds include millions of electron-hole pairs along the track of the alpha particle, which discharge the storage cell capacitors, the bit-lines, particularly if they are diffused, and the sensing nodes in the sense amplifiers of the memory cell arrays of the integrated circuit. However, errors induced by alpha particles are related almost exclusively to the amount of stored charge. In dynamic random access memories (DRAMs), alpha particles cause a loss of memory, but do not physically damage the integrated circuit's memory cells. This is referred to as a "soft error" since there is no physical damage to the memory cell, but merely a temporary loss of charge. However, this problem results in few flip chip DRAMs. Many in the art wire bond a die to an interposer, then attach the interposer to a substrate using flip chip technology.

Referring to FIG. 1, in many flip chip memory circuits, the bond pads are positioned in a row and column array, referred to as an area array, across the active surface of the chip. Area arrays are often arranged in standardized footprints in order to match to corresponding sites on a substrate. In many such arrays, several of the bond pads are located over memory cells, which are known by those of skill in the art to be the more fragile portions of a memory circuit.

Many flip chip DRAM integrated circuits are coated with a relatively thick coating to absorb alpha radiation and lower the soft error rates, such coatings include, without limitation, polyimides and glasses, such as borophosphosilicate glass (BPSG), phosphosilicate glass (PSG) and borosilicate glass (SG). When glass is used as the coating material, the layer may be as much as 6 mils thick. This coating can be applied either to the chip during the assembly process when it is known as "chip coat" or "die coat", or it can be applied to the wafer during the manufacturing process when it is called a "wafer coat". Alternatively, because thick coats of such materials tends to slow heat transfer away from the flip chip die, metal layers may be used to shield the memory arrays of DRAM dice from alpha particle penetration. A layer of alpha radiation absorbent material may also be injected between the integrated circuit on the active surface of a flip chip die and a carrier substrate to prevent alpha particles from penetrating areas of the integrated circuit adjacent to the bond pads.

Several disadvantages are inherent with flip chips having bond pads disposed in area arrays. First, additional circuitry is necessary to operatively connect the bond pads of such an area array to associated logic portions of the integrated circuit. Second, alpha radiation-absorbent layers and, therefore additional manufacturing steps, are often necessary to shield the integrated circuit's memory cells from alpha radiation emitted by the solder balls formed on and attached to the bond pads. Third, because many of the bond pads overlay memory cells, much of the weight of the integrated circuit is supported by the more fragile portions of the chip. Finally, due to the continual increase of integrated circuit densities, size and pitch limitations are potential problems with flip chips having area arrays.

It is well known to those of ordinary skill in the art that longer circuit trace runs increase power requirements. Longer traces also increase the amount of heat generated during the operation of an integrated circuit. When longer traces are used, it takes electrons longer to flow from one point to another. Thus, the overall speed of an integrated circuit is increased as the length of circuitry between logic portions and the bond pads is reduced. Thus, integrated circuits with bond pads removed from their associated circuitry are undesirable.

The use of alpha-particle absorbing layers is also undesirable in that such layers require an additional step in the manufacture of the integrated circuit. Additional manufacturing steps introduce an increased likelihood of damaging each chip, as well as increased manufacturing costs. Similarly, the placement of bond pads on the active surface over memory cells increases the likelihood that an integrated circuit will be damaged by impacts or loads placed on the die during bonding to a carrier substrate, especially in the case of memory integrated circuits, which tend to be larger and heavier than many other integrated circuits.

Many integrated circuits include bond pads which are positioned around the outer periphery of the device. Wire bonded integrated circuits and flip chip integrated circuits with peripheral bond pads (shown in FIG. 2) are examples of such integrated circuits. Although integrated circuits employing such bond pad placement are not subject to as many soft errors as area array flip chips, peripheral bond pad placement requires the use of electrical circuit traces, also referred to merely as "traces", between the bond pad and the corresponding logic circuits of the chip. In many of the integrated circuits with peripheral bond pads, the bond pads are positioned over dead areas of the chip—areas which include neither logic nor memory. When solder is used to connect such an integrated circuit to a substrate, constraints on the minimum possible size and spacing, or "pitch", of solder bumps limit the number of connections that can be made with the substrate.

The disadvantages of extended circuit traces have been discussed above. Integrated circuits requiring peripheral bond pads are also undesirable because the peripherally located bond pads are positioned over areas of the chip which do not include logic circuits memory cell arrays. Thus, a significant amount of the surface area of the chip is not utilized, necessitating a larger integrated circuit than would otherwise be required. Therefore, the chip density per wafer is not maximized with such integrated circuit configurations.

Peripherally bonded integrated circuits which are connected to a substrate with solder bumps also include a limited number of bond pads due to minimum physical size limitations of a solder ball. However, even as the internal circuit element sizes of integrated circuits decrease, the number of connections required may either increase or, at best, remain the same. Thus, ball size and pitch limitations in such integrated circuits prevent further reduction in the die size of integrated circuits with peripheral bond pads even if more active circuit elements could otherwise be accommodated.

Alpha particles have a known energy range. Thus, many integrated circuit manufacturers have attempted to design memory cells with sufficient capacitance to enable the charge generated from an alpha hit to be absorbed without changing the value of that cell from a one to a zero. The increased capacitance of such cells improves the soft error rate in DRAMs.

However, increasing the capacitance of an integrated circuit requires a redesign of the integrated circuit, which is undesirable to many manufacturers. For example, in order to increase the capacitance of an integrated circuit, the gate oxide thickness must be scaled down as the DRAM cell is scaled laterally, or a gate material which has a higher dielectric constant than silicon dioxide must be used, including without limitation, silicone nitride, ferro electric materials, or others.

What is needed is an integrated circuit device which is of reduced susceptibility to memory loss caused by alpha particles without the requirement of a surface coating for protection from alpha particles. Further, more efficient use of the die "real estate" is needed, as is an integrated circuit with flip chip connections which are not pitch-limited. A more robust chip, providing greater speed, with lower power requirements and lower heat output is also desirable.

SUMMARY OF THE INVENTION

The integrated circuit device of the present invention addresses each of the foregoing needs. The bond pads of the device of the present invention are positioned over the surface of the device rather than along the outer periphery thereof, which permits a decrease in the size of the die compared to peripherally bonded integrated circuits, making more efficient use of the surface area of the die and permitting use of a given memory capacity with a smaller die. Preferably, the bond pads of the device are arranged over the relatively durable logic areas thereof. Thus, the integrated circuit of the present invention withstands mechanical fatigue better than many comparable devices which are currently known and used in the industry. The bond pads are positioned such that the length of the electrical traces, or connective circuitry, between a bond pad and its corresponding logic component is significantly reduced, or such electrical traces are eliminated, which decreases the overall resistance of the circuit and, thus, its power requirements, which, in turn, reduces the heat generated during operation of the integrated circuit. The reduced length of the circuit traces in the device of the present invention also decreases the amount of time it takes an electrical impulse to travel from the logic area to the bond pad, thus increasing the potential speed of the device.

The bond pads of the integrated circuit device of the present invention are positioned over the logic areas of the device, rather than over the memory array(s). When the bond pads of the device are attached to a substrate, such as a printed circuit board or other substrates which are well known in the industry, with a lead/tin (Pb/Sn) solder, alpha particles emitted from the solder are unlikely to enter the laterally-offset memory array and create "soft" errors therein. Thus, it is a consequent advantage that the integrated circuit device of the present invention is less susceptible to memory loss caused by alpha particles than presently known integrated circuits. Further, the device of the present invention requires little or no protective coating over the active surface due to the placement of bond pads over the logic areas of the device. As a result, no protective coatings such as the protective metal shields, polyimide layers, glass layers and other protective layers that are used in many flip chip integrated circuits are necessary on the device of the present invention.

The integrated circuit die according to this invention includes bond pads spaced over large portions of the active surface thereof, rather than being located at the die periphery over a "dead space" portion of the die which is used for neither memory nor for logic. Consequently, the die of the integrated circuit of this invention need not include dead space for positioning the bond pads, so that the overall physical size of the die for a given memory capacity may be reduced.

In a preferred embodiment of the device of the present invention, the placement of bond pads over the more durable logic portions of the integrated circuit improves the device's ability to withstand mechanical stress when compared with flip chip integrated circuits which include bond pads positioned over memory cell arrays.

The apparatus of the present invention may be fabricated at the semiconductor die level, at the wafer level, or at a partial wafer level wherein a partial wafer includes a plurality of die locations. As used herein the term "wafer" includes conventional, disc-shaped substrates of semiconductor material (silicon, gallium, arsenide, etc.) as well as silicon-on-insulator (SOI) substrates such as silicon-on-glass (SOG), silicon-on-sapphire (SOS), and others known in the art.

Other advantages of the present invention will become apparent to those of ordinary skill in the pertinent art through a consideration of the appended drawings, taken in conjunction with the ensuing description.

DETAILED DESCRIPTION OF THE PREFERRED EMBODIMENTS

Figure 3:
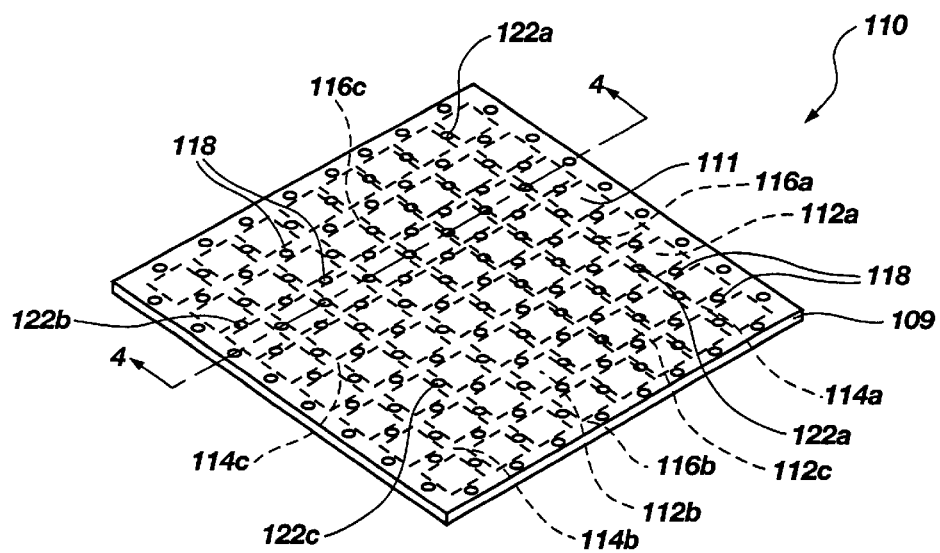
FIG. 3 illustrates one preferred embodiment of an integrated circuit according to the present invention.

Referring to FIG. 3, an integrated circuit 110 according to a preferred embodiment of the present invention includes an active surface 111 having a plurality of memory cell arrays 112a, 112b, 112c, etc., which are also referred to as memory elements, thereon, a plurality of column decoders 114a, 114b, 114c, etc. (referred to collectively as 114) thereon, which are located adjacent to the columns of the memory arrays, and a plurality of row decoders 116a, 116b, 116c, etc. (referred to collectively as 116) thereon, which are located between adjacent rows of the memory arrays. Column decoders 114 and row decoders 116 comprise the logic circuits 118, which are also referred to as the non-memory circuitry of integrated circuit 110. Integrated circuit 110 also includes bond pads 122a, 122b, 122c, etc. (referred to collectively as 122), which are disposed in an area array over logic circuitry of active surface 111 of integrated circuit.

Figure 4:
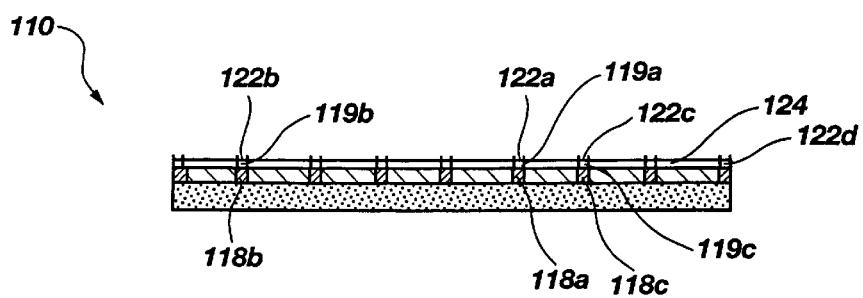
FIG. 4 is a cross-section taken along line 4—4 of FIG. 3.

With reference to FIG. 4, column decoders (reference character 114 in FIG. 3) and row decoders 116 are collectively referred to as the logic circuits 118a, 118b, 118c, etc. (referred to collectively at 118) of integrated circuit 110. Bond pads 122 are located directly over logic circuits 118. Preferably, each active logic circuit 118a is in electronic communication with at least one corresponding, substantially superimposed bond pad 122a. More preferably, bond pads 122a, 122c, etc. are each positioned directly above their corresponding active logic circuit 118a, 118c, etc. and in direct electronic communication therewith.

With reference to FIG. 4, integrated circuit 110 may also include a passivation layer 124 of dielectric or insulative material, which is disposed over active surface 111. Dielectric and insulative materials which are useful as layer 124 in the present invention include any of those which are known in the pertinent art. Such materials include, but are not limited to polyimides, phosphosilicate glasses, borosilicate glasses, borophosphosilicate glasses, lead borosilicate glasses, silicon nitrides, silicon dioxides, and other suitable insulative or dielectric materials.

Figure 1:
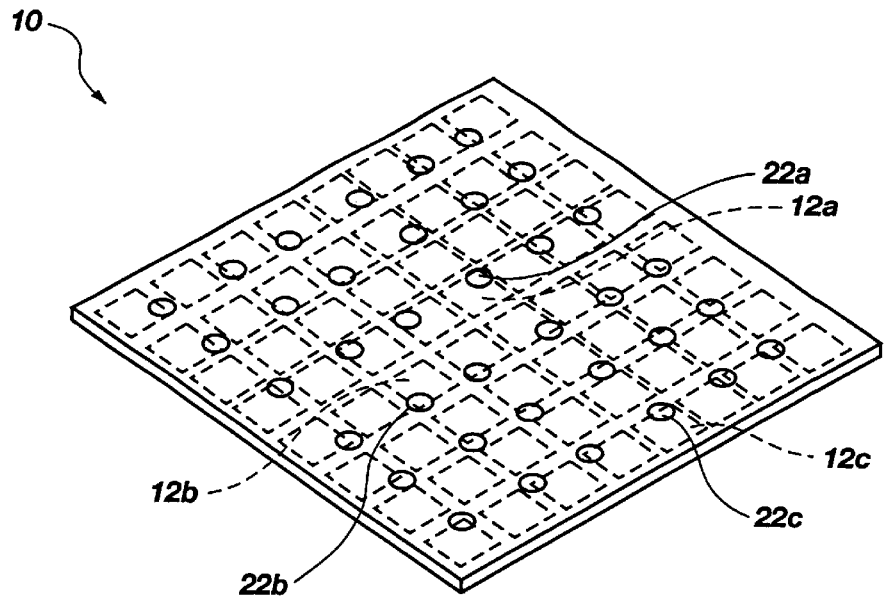
FIG. 1 depicts an exemplary prior art flip chip integrated circuit having bond pads disposed on the active surface thereof in an area array.

As those of ordinary skill in the art are aware, alpha particles cause soft errors in DRAM memory cells by generating up to about a million ($10^6$) or more electron—hole pairs, which essentially drains electrons from charged memory cells, changing the value for each such cell from a 1 to a 0 until the next refresh cycle. It is also well known in the art that commonly used lead/tin solders are the primary source of alpha particle emission in packaged integrated circuits. Alpha particles are emitted during the decay of radioactive present in the isotopes presented in the lead. Alpha particles emitted from the lead constituent present in a solder bump tend to enter the penetrate the areas of the chip which are closest to the solder bump. As mentioned above in reference to FIG. 1, many prior art flip chip integrated circuits 10 include bond pads 22a, 22b, 22c, etc. directly over memory cell arrays 12a, 12b, 12c, etc., respectively. Thus, the solder bumps formed over those bond pads are extremely close to alpha particle-susceptible memory cell arrays 12a, 12b, 12c, etc. of the integrated circuit. Consequently, alpha particles emitted from such solder bumps tend to penetrate the immediately underlying memory cell array rather than other portions of the integrated circuit which are laterally offset from the bumps.

Alpha particles have not been found by those of ordinary skill in the pertinent art to detrimentally affect the logic portions of an integrated circuit (i.e., the row decoders and column decoders) to any perceptible extent. Referring again to FIG. 3, the bond pads 122 in the preferred embodiment of the integrated circuit 110 flip chip memory device of the present invention are arranged over their corresponding column decoders 114 and row decoders 116. Thus, with the bond pad configuration of the present invention, any alpha particles emitted by solder bumps on the bond pads 122 tend to enter the logic circuits 118 of the chip rather than the memory cell arrays 112. Therefore, the incidence of alpha particle penetration into the memory cell arrays of the preferred integrated circuit according to this invention is reduced when compared with area array flip chip integrated circuits.

Consequently, the reduced tendency of alpha particles to penetrate the memory cell arrays of the integrated circuit reduces or eliminates the need for thick, robust protective coatings of polyimide, glass, and/or other alpha particle absorbent materials. Accordingly, additional fabrication steps for coating the integrated circuits of the present invention and their accompanying costs are also reduced or eliminated.

Figure 2:
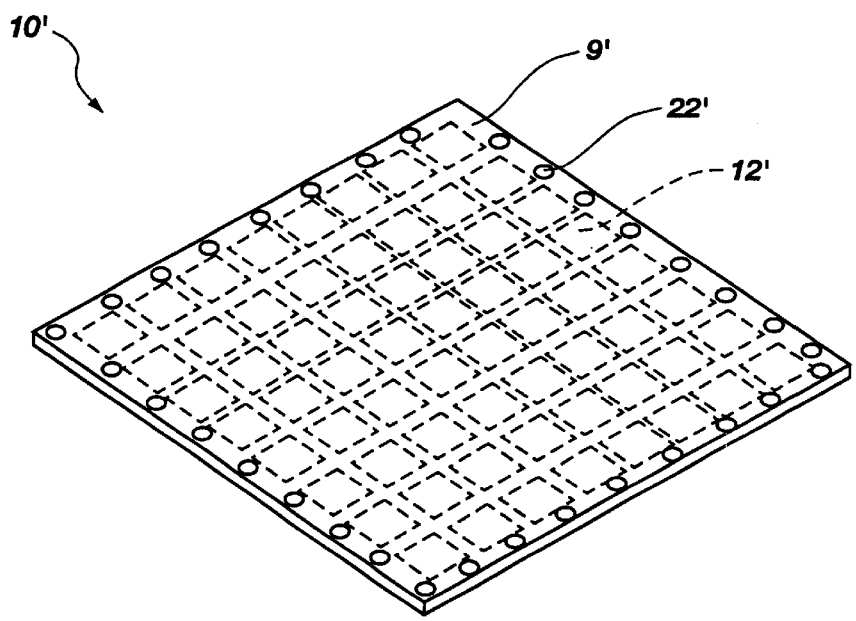
FIG. 2 depicts a second exemplary prior art flip chip integrated circuit having bond pads disposed on the outer periphery thereof.

With reference to FIG. 2, in many memory integrated circuits 10' which have peripherally located bond pads, the outer periphery of the die 9' is not used for logic or memory (i.e., the outer periphery of such die includes dead space). Alpha particles emitted from lead-containing solder (not shown) bonded to peripherally located bond pads 22' are unlikely to penetrate the memory cell arrays 12' of such integrated circuits 10'. However, integrated circuits with peripheral bond pads are becoming increasingly subject to solder ball size and pitch limitations. Such integrated circuits also fail to efficiently maximize use of surface area or "real estate" of the die for memory and logic functions.

Due to the continually increasing active circuit component densities and shrinking geometries of integrated circuits, size and pitch limits of integrated circuits having peripheral bond pads are becoming limiting factors in further reducing die size. The size and pitch limits are imposed by the minimum useful size of solder balls. Solder ball size and shape are limited by several factors, including, without limitation, the surface tension of the solder, the amount of solder necessary to properly connect the bond pad to the corresponding terminal on the substrate, the amount of solder necessary to compensate for non-planarity of the substrate, and others. Similarly, pitch, which is the center-to-center spacing between adjacent bond pads is limited by the minimum possible size of solder balls attached thereto.

Turning again to FIG. 3, the arrangement of bond pads 122 over logic circuits 118 in the preferred integrated circuit 110 of the present invention facilitates increased bond pad density over the surface of the device when compared with integrated circuits having peripherally located bond pads.

Figure 4A:
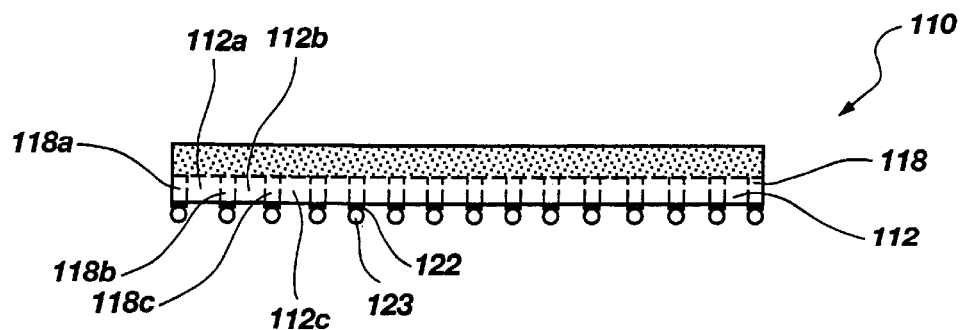
FIGS. 4a and 4b are inverted cross-sectional views which illustrate the integrated circuit of FIG. 3 with bumped bond pads.
Figure 4B:
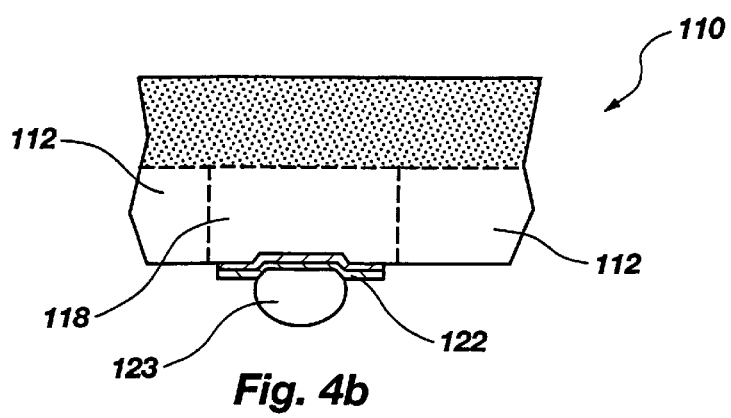

It is well known in the pertinent art that the logic circuits of an integrated circuit tend to be significantly more physically robust and durable than the memory cell arrays. Referring now to FIGS. 4a and 4b, the portions of flip chip integrated circuits which are overlaid with bumped bond pads 122 are subject to greater stress than other portions of the chip, especially during packaging where forces transverse to the plane of the die are often concentrated on the bond pads. A bumped bond pad is a bond pad 122 which has a solder ball 123 disposed thereon. In the preferred embodiment, bond pads 122 and solder balls 123 are located over the structurally more robust logic circuits 118 of the chip, which results in application of stresses to those durable portions of the chip, rather than directly to the fragile memory cell arrays 112. Thus, the integrated circuit device of the present invention is less likely to be damaged by stresses or loads placed thereon than comparable devices in the prior art.

Referring again to FIG. 4, the bond pads 122 of the present invention are preferably positioned directly over their corresponding active logic circuit 118. Bond pads 122 are each connected to their corresponding logic circuit 118 at an extremely short vertical connection 119. In comparison, integrated circuits having peripheral bond pads (FIG. 2) and integrated circuits with area arrays (FIG. 1) require increased laterally-extending lengths of trace runs to operatively connect their logic portions to the corresponding bond pads. Integrated circuits with peripheral bond pads require at least one layer of wiring to connect the logic portions with the appropriate bond pads. Conventional integrated circuits with bond pads distributed in area arrays, such as for flip chip applications, require a layer of traces to operatively connect the bond pads to their corresponding row decoder or column decoder. Typically, such traces require at least one (in integrated circuits with peripheral bond pads) or more (in integrated circuits with area arrays of bond pads) metal deposition, masking and etch steps. Such additional steps are eliminated in the fabrication of the integrated circuit device of the present invention, consequently reducing manufacturing costs and improving product yield by eliminating potential defect opportunities.

Those of ordinary skill in the relevant art are also aware that chips having lengthy circuit traces increase the overall resistance of the circuit. Thus, the power requirements of the circuit are also increased, which in turn increases the amount of heat generated during operation of the integrated circuit. The lengthy circuit traces of such integrated circuits also increase the amount of time it takes an electrical impulse to travel from the logic portion to the bond pad. The flip chip integrated circuit of the present invention has substantially shorter lengths of circuit traces than flip chip integrated circuits in the prior art which include peripheral bond pads and bond pads in area arrays, as the present invention deploys bond pads in immediate vertical proximity to their associated circuits. Thus, the integrated circuit according to the present invention requires less power and generates less heat than comparable devices of conventional configurations employing peripheral or area array bond pads.

The reduced length of circuit traces between bond pads and their corresponding row or column decoders in the preferred embodiment of the present invention also increases the overall speed of the integrated circuit. Bond pad connections 119, which preferably comprise the direct vertical connection of bond pad 122 to its corresponding underlying logic circuit 118, are significantly shorter than the electrical traces which connect a bond pad to its corresponding decoder in prior art flip chip integrated circuit devices. The amount of time it takes electrons to travel over a connection is inversely proportionate to the length of the connection. Thus, the amount of time it takes an electron to travel across bond pad connection 119, from decoder 114, 116 to bond pad 122, in the preferred embodiment of the present invention is significantly less than the length of time it takes an electron to travel from a decoder to a corresponding, laterally offset bond pad in prior art flip chip integrated circuits.

The integrated circuits of the present invention may use existing integrated circuit designs. In other words, little or no reworking of the location of logic circuits and memory cell arrays is necessary to accommodate the incorporation of existing integrated circuit designs into the device of the present invention. Because the bond pads in the present invention are directly connected with the logic circuits of the device, several of the re-patterning steps, which are necessary in the prior art to laterally connect the logic circuits to peripheral or area array bond pads, are eliminated. Such re-patterning steps generally require one or more layers of metal deposition, masking and etching. The reduction or elimination of such steps decreases the cost as well as the potential for failure of the integrated circuit.

Referring again to FIG. 3, a preferred method for fabricating a high density bond pad array includes procuring a die 109 with an active surface 111 thereon, the active surface including memory cell arrays 112 and logic circuits 118, each of the logic circuits being adjacent to at least one of the memory cell arrays. Alternatively, the method may include fabrication of integrated circuit 110 by methods which are well known in the industry.

Using techniques which are known in the industry, bond pads 122a, 122b, 122c, etc. are fabricated directly over logic circuits 118. At least some bond pads 122a, 122c, etc. are in electronic communication with a corresponding logic circuit 118a, 118c, etc. Preferably, a connection (via) 119 is formed over each active logic circuit 118 extending to a bond pad location. Bond pads 122 are then formed over vias 119 to place the bond pads in direct electronic communication with their corresponding logic circuit 118. Alternatively, bond pads 122 may be formed directly over and in contact with logic circuits 118 if the circuit design so permits.

A passivation layer of any suitable dielectric or insulative material which is known in the pertinent art, including, without limitation, polyimides, borosilicate glasses, borophosphosilicate glasses, aluminum nitride, boron nitride, quartz and others, may then be disposed over each of the memory cell arrays and logic circuits by methods which are known in the industry. If such a layer is fabricated on the device, the areas of the layer which overlay bond pads 122 are then removed from the bond pads by known etching techniques.

Preferably, bond pads 122 are then bumped with discrete connective elements, which include, but are not limited to, tin/lead solders, conductive epoxies and conductor-filled epoxies, by techniques that are known in the industry. Preferably, solder bumps may be applied to the bond pads by screening or stenciling techniques, then re-flowed to form spheres over the bond pads. Bumps or pillars of conductive or conductor-filled epoxy may be formed on the bond pads by screening or stenciling techniques. Epoxy pillars may be formed of B-stage epoxy which is first preliminarily cured to a tacky state to maintain its shape prior to assembly of the flip chip to a carrier substrate. Then, when the epoxy pillars are placed in contact with a carrier substrate, they are heat-cured to form a permanent mechanical and electrical bond with the terminal pads of the carrier substrate.

Figure 5:
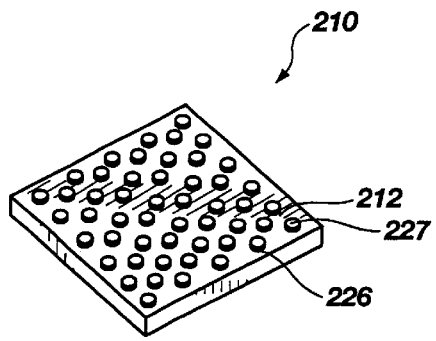
FIG. 5 is a perspective view showing the bottom of the integrated circuit shown in FIG. 3, with an exemplary embodiment of a coating thereon.
Figure 6:
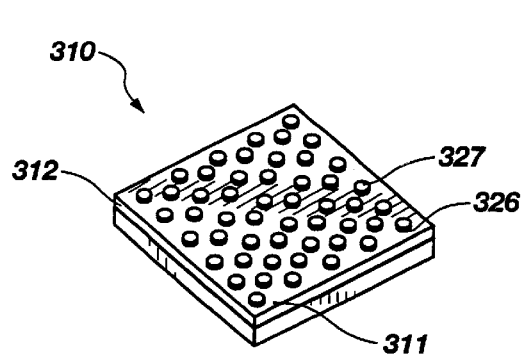
FIG. 6 is a perspective view showing the bottom of the integrated circuit shown in FIG. 3, with a second exemplary embodiment of a coating thereon.

FIG. 5 illustrates an integrated circuit 210 according to the present invention which includes a preferred embodiment of a coating 212 thereon. Coating 212 preferably encapsulates the entire chip, leaving only the outer surface 227 of each solder ball 226 exposed. Preferably, encapsulants which are useful as coating 212 have low levels of ionic contaminants, good thermal stability, good electrical insulating properties, good moisture resistance, low internal stress, solidify quickly and adhere well to the integrated circuit. Encapsulants, including, but not limited to, silicone encapsulants, epoxy potting compounds, resinous molding compounds, each of which are known and used in the industry, and other polymeric plastic materials, are useful as coating 212. FIG. 6 shows another embodiment of a coating 312, wherein only active surface 311 of integrated circuit 310 is coated, rather than the entire integrated circuit.

Figure 7:
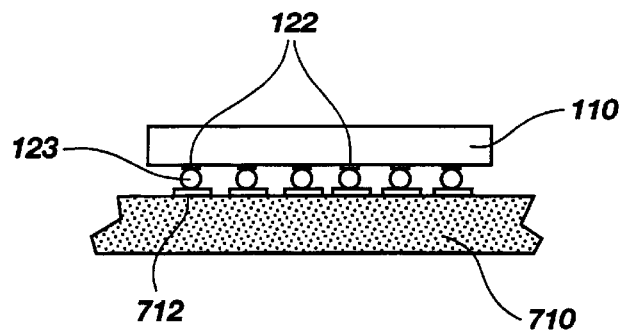
FIG. 7 is a side plan view which illustrates the attachment of the integrated circuit of FIG. 3 to a carrier substrate.

With reference to FIG. 7, attachment of the integrated circuit 110 to a carrier substrate 710 is shown. Discrete connective elements 123 of any of the aforementioned types electrically connect integrated circuit 110 to corresponding terminals 712 on carrier substrate 710, which are disposed in a pattern which corresponds to the area array of bond pads 122 on the integrated circuit. In attaching integrated circuit 110 to carrier substrate 710, the integrated circuit is inverted and oriented over the carrier substrate such that bond pads 122 are aligned with their corresponding terminals 712. Pressure is applied to one or both of integrated circuit 110 and carrier substrate 710 to bring each bond pad 122, a discrete connective element 123, and a respective terminal 712 together. As integrated circuit 110 and carrier substrate 710 are placed in mutual contact, force is applied transversely to the plane of the active surface of integrated circuit 10 against bond pads 122, which transfer such forces to the circuitry underlying the bond pads 122. Advantageously, as discussed above in reference to FIGS. 4a and 4b, bond pads 122 are positioned over the more robust logic circuits, rather than over memory cell arrays, which are more likely to be damaged by loads placed thereon.

Figure 8:
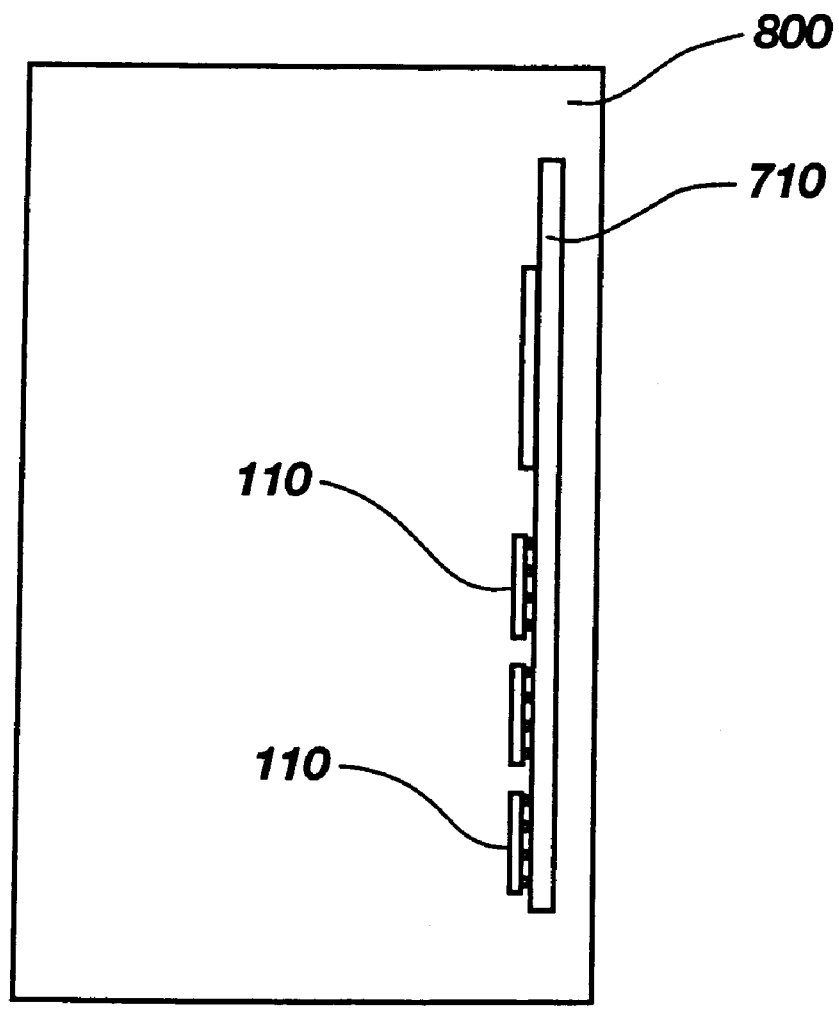
FIG. 8 is a schematic representation of the invented flip chip in a computer.

FIG. 8 illustrates a computer 800 including a carrier substrate 710. A plurality of integrated circuits 110 attaches to carrier substrate 710 to form a memory or other multi-chip module, which in turn is incorporated with the integrated circuits into computer 800.

Although the foregoing description contains many specificities, these should not be construed as limiting the scope of the present invention, but as merely providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. Additions, deletions and modifications to the embodiments of the invention as disclosed, and the combination of features of different embodiments, are specifically contemplated as falling within the scope of the invention.

What is claimed is:

1. An integrated circuit device, comprising:
    a semiconductor die having an active surface including at least one memory cell array and at least one logic circuit element comprising at least one of a column decoder and a row decoder positioned adjacent to at least one memory cell of said at least one memory cell array and carried by said semiconductor die; and
    an array of bond pads on said active surface of said semiconductor die, at least a portion of at least one bond pad of said array of bond pads being located vertically over said at least one logic circuit element.

2. The integrated circuit device according to claim 1, wherein said at least one bond pad is operatively connected with said at least one logic circuit element.

3. The integrated circuit device according to claim 2, wherein said at least one bond pad is in direct contact with said at least one logic circuit element.

4. The integrated circuit device according to claim 1, wherein said at least one bond pad is laterally offset from said at least one memory cell array.

5. The integrated circuit device according to claim 1, wherein the integrated circuit device comprises a dynamic random access memory integrated circuit.

6. The integrated circuit device according to claim 1, further comprising a discrete external connective element in electronic communication with said at least one bond pad.

7. The integrated circuit device according to claim 6, further comprising an encapsulant, said encapsulant covering said at least one memory cell array and said at least one logic circuit element.

8. The integrated circuit device according to claim 7, wherein said encapsulant covers all external surfaces of said semiconductor die, but for said discrete external connective element.

9. A dynamic random access memory integrated circuit device, comprising:
    a die having an active surface bearing a plurality of memory cell arrays and a plurality of logic circuit elements, each of said plurality of logic circuit elements comprising at least one of a column decoder and a row decoder; and
    a plurality of bond pads located on said active surface of said die, each of said plurality of bond pads being associated with a corresponding one of said plurality of logic circuit elements, each of said plurality of bond pads directly overlying a corresponding logic circuit element of said plurality.

10. The dynamic random access memory integrated circuit device according to claim 9, wherein said each of said plurality of bond pads is disposed over its associated logic circuit element.

11. The dynamic random access memory integrated circuit device according to claim 9, further comprising a plurality of discrete external connective elements, each being in electrical communication with an underlying bond pad, wherein at least a portion of the integrated circuit device is encapsulated with an encapsulant through which each of said plurality of discrete connective elements extends.

12. The dynamic random access memory integrated circuit device according to claim 11, wherein said encapsulant covers said plurality of memory cell arrays and said plurality of logic circuit elements.

13. The dynamic random access memory integrated circuit device according to claim 11, wherein said encapsulant covers all external surfaces of said die.

14. An integrated circuit device, comprising:
    a semiconductor die including an active surface, a memory cell array and a logic circuit element positioned between adjacent memory cells of said memory cell array; and
    at least one bond pad located on said active surface of said semiconductor die, at least a portion of said at least one bond pad being positioned at least partially vertically over said logic circuit element.

15. The integrated circuit device according to claim 14, wherein said at least one bond pad is operatively connected with said logic circuit element.

16. The integrated circuit device according to claim 15, wherein said at least one bond pad directly overlies said logic circuit element.

17. The integrated circuit device according to claim 14, wherein said at least one bond pad is laterally offset from said memory cell array.

18. The integrated circuit device according to claim 14, wherein the integrated circuit device is a dynamic random access memory integrated circuit.

19. The integrated circuit device according to claim 14, further comprising a discrete external connective element formed over and in electrical communication with said at least one bond pad.

20. The integrated circuit device according to claim 19, further comprising an encapsulant covering said memory cell array and said logic circuit element with said discrete external connective element extending through said encapsulant.

21. The integrated circuit device according to claim 20, wherein said encapsulant covers all external surfaces of said semiconductor die.

22. A flip chip DRAM, comprising:
- a die including a memory cell array and at least one logic circuit element comprising at least one of a column decoder and a row decoder; and
- at least one discrete external connective element disposed on an active surface of said die, at least a portion of said at least one discrete external connective element being positioned vertically over said at least one logic circuit element.

23. The flip chip DRAM of claim 22, wherein said at least one discrete external connective element is laterally offset from memory cells of said memory cell array.

24. The flip chip DRAM of claim 22, further comprising at least one bond pad at least partially positioned vertically over said at least one logic circuit element.

25. The flip chip DRAM of claim 24, wherein said at least one discrete external connective element is disposed on said at least one bond pad.

26. The flip chip DRAM of claim 25, wherein said at least one bond pad operatively connects said at least one discrete external connective element to said at least one logic circuit element.

27. A memory device, comprising:
- at substrate;
- at least one active memory element on said substrate;
- at least one active non-memory circuit comprising at least one of a column decoder and a row decoder carried by said substrate laterally adjacent said at least one active memory element; and
- at least one electrically conductive bump disposed on said substrate substantially vertically over said at least one active non-memory circuit.

28. The memory device of claim 27, further comprising at least one bond pad formed over said at least one active non-memory circuit.

29. The memory device of claim 28, wherein said at least one electrically conductive bump is formed on said at least one bond pad.

30. The memory device of claim 28, wherein said at least one bond pad operatively connects said at least one active non-memory circuit to said at least one electrically conductive bump.

31. The memory device of claim 27, wherein said at least one electrically conductive bump is laterally offset from said at least one active memory element.

32. A DRAM, comprising:
- a substrate;
- at least one memory cell on said substrate;
- at least one logic circuit element comprising at least one of a column decoder and a row decoder on said substrate, adjacent and in communication with said at least one memory cell; and
- at least one bond pad disposed on said substrate and at least partially vertically over said at least one logic circuit element.

33. The DRAM of claim 32, wherein said at least one bond pad is laterally offset from said at least one memory cell.

34. The DRAM of claim 32, further comprising at least one electrically conductive bump disposed on said at least one bond pad.

35. A memory device, comprising:
- a substrate;
- at least one active memory element on said substrate;
- at least one active non-memory circuit comprising at least one of a column decoder and a row decoder on said substrate, adjacent said at least one active memory element; and
- at least one bond pad disposed on said substrate, at least a portion of said at least one bond pad being positioned vertically over said at least one active non-memory circuit.

36. The memory device of claim 35, wherein said at least one bond pad is laterally offset from said at least one active memory element.

37. The memory device of claim 35, further comprising at least one discrete external connective element disposed on said at least one bond pad.

* * * * *

UNITED STATES PATENT AND TRADEMARK OFFICE
CERTIFICATE OF CORRECTION

PATENT NO. : 6,329,712 B1
DATED : December 11, 2001
INVENTOR(S) : Salman Akram, Warren M. Farnworth and Alan G. Wood Page 1 of 2

It is certified that error appears in the above-identified patent and that said Letters Patent is hereby corrected as shown below:

Title page,
Item [56], References Cited, U.S. PATENT DOCUMENTS, after "Dass et al." change "438/601" to -- 438/18 --

Drawings,
FIG. 6, delete reference numerals "326" and "327"
Please replace FIG. 6 with the following:

--
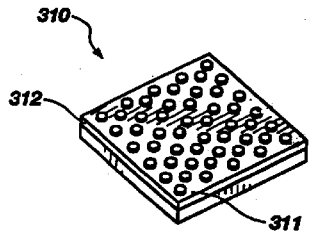
Fig. 6
--

Column 1,
Line 57, after "rates" delete "," and insert -- ; --
Line 60, change "(SG)" to -- (BSG) --

Column 2,
Line 2, change "radiation absorbent" to --radiation absorbent --
Line 62, after "circuits" insert -- or --

Column 3,
Line 26, after "ing" (beginning of line) insert -- , --

Column 4,
Line 10, after "coatings" insert -- , --
Line 13, after "circuits" insert -- , --

UNITED STATES PATENT AND TRADEMARK OFFICE
CERTIFICATE OF CORRECTION

PATENT NO. : 6,329,712 B1
DATED : December 11, 2001
INVENTOR(S) : Salman Akram, Warren M. Farnworth and Alan G. Wood It is certified that error appears in the above-identified patent and that said Letters Patent is hereby corrected as shown below:

Column 5,
Line 19, change "of" to -- on -- and before "integrated" insert -- the --
Line 23, change "at" to -- as --
Line 37, after "limited to" insert -- , --
Line 50, after "radioactive" insert -- isotopes -- and after "present in the" delete "isotopes presented in the"
Line 52, delete "enter the"

Column 9,
Line 19, change "10" to -- 110 --

Signed and Sealed this

Twenty-sixth Day of November, 2002

Attest:

JAMES E. ROGAN
Attesting Officer   Director of the United States Patent and Trademark Office